(12) United States Patent
Roizin et al.

(10) Patent No.: US 10,083,771 B2
(45) Date of Patent: Sep. 25, 2018

(54) RADIOISOTOPE POWER SOURCE EMBEDDED IN ELECTRONIC DEVICES

(71) Applicants: Tower Semiconductor Ltd., Migdal Haemek (IL); RedCat Devices Srl, Milan (IT)

(72) Inventors: Yakov Roizin, Afula (IL); Cristiano Calligaro, Torre d'Isola (IT)

(73) Assignees: Tower Semiconductor LTD (IL); Redcat Devices SRL (IT)

( * ) Notice: Subject to any disclaimer, the term of this patent is extended or adjusted under 35 U.S.C. 154(b) by 623 days.

(21) Appl. No.: 14/753,174

(22) Filed: Jun. 29, 2015

(65) Prior Publication Data
US 2016/0379729 A1     Dec. 29, 2016

(51) Int. Cl.
*G21H 1/06*     (2006.01)
*H01L 27/142*     (2014.01)
*G11C 11/417*     (2006.01)
*G11C 5/14*     (2006.01)
*H01L 27/06*     (2006.01)

(52) U.S. Cl.
CPC ............. *G21H 1/06* (2013.01); *H01L 27/142* (2013.01); *G11C 5/14* (2013.01); *G11C 11/417* (2013.01); *H01L 27/0617* (2013.01)

(58) Field of Classification Search
CPC ............................... H01L 31/18; H01L 31/115
USPC ........................................................ 310/303
IPC ............................................ H01L 31/18,31/115
See application file for complete search history.

(56) References Cited

U.S. PATENT DOCUMENTS

| | | | |
|---|---|---|---|
| 6,911,711 B1 * | 6/2005 | Shimabukuro | G21H 1/06 257/429 |
| 2010/0213379 A1 * | 8/2010 | Lal | G01T 1/2018 250/369 |
| 2011/0291210 A1 * | 12/2011 | Batchelder | G21H 1/06 257/429 |
| 2012/0186637 A1 * | 7/2012 | Batchelder | H01L 31/068 136/253 |
| 2014/0159541 A1 * | 6/2014 | Kwon | G21H 1/06 310/301 |
| 2014/0307481 A1 * | 10/2014 | Wang | H02M 3/285 363/17 |
| 2016/0379729 A1 * | 12/2016 | Roizin | G21H 1/06 310/303 |

* cited by examiner

*Primary Examiner* — John K Kim
(74) *Attorney, Agent, or Firm* — Janeway Patent Law PLLC

(57) ABSTRACT

An electronic device is proposed. The electronic device comprises: at least one electronic component formed in a chip of semiconductor material; at least one radioisotope power source unit comprising a radioactive material. The at least one radioisotope power source unit is embedded in the chip of semiconductor material together with the at least one electronic component. Moreover, the at least one radioisotope power source unit is arranged for providing electric power to said at least one electronic component by absorbing particles emitted by said radioactive material comprised in the least one radioisotope power source unit.

24 Claims, 11 Drawing Sheets

RADIOISOTOPE POWER SOURCE EMBEDDED IN ELECTRONIC DEVICES

FIELD OF THE INVENTION

The present invention relates to power sources. In detail, the present invention refers to radioisotope power sources, i.e. power source based on a radioactive decay process of a radioactive material rather than a chemical reaction in order to generate power. In more detail the present invention relates to a radioisotope power source that may be embedded in electronics devices and arranged to provide electric power to electronic components thereof. Moreover, the present invention relates to methods for embedding a radioisotope power source in an electronic device.

BACKGROUND OF THE INVENTION

Power sources for electronics products are one of the main issues in modern electronics. Portable electronic devices, particularly in consumer electronics (e.g., portable computers, smartphones and tablets), have known a very widespread diffusion. Moreover, electronic devices for industrial, automotive and aerospace applications often require a stand alone power supply in order to ensure a reliable operation. Generally, all these electronic devices rely on battery arrangements as (portable) power sources for receiving a (electric) power required for their operation.

While most of the power sources are based on chemical reaction in order to supply power (e.g., lithium-ion batteries), power sources based on a radioactive decay process of radioactive material, also identified as 'radioisotope power sources', have been proposed for supplying power to electronics products.

Such radioisotope power sources are arranged to generate electric power on the basis of energy released by the decaying of the radioactive element comprised in the radioisotope power sources rather than on the basis of chemical reactions between different materials as in common batteries.

Such radioisotope power sources are able to provide power for very long periods of time (e.g., in the order of tens of years), i.e. substantially until the radioactive decay process of the radioactive material is completed, without requiring to be recharged and with a very limited size.

An example of a known radioisotope power source may be found in U.S. Pat. No. 8,634,201 that discloses an assembly carrying a radioisotope power source for attaching to a printed circuit board. The assembly comprises an integrated circuit package carrying an integrated circuit, the integrated circuit package having first contacts on a lower surface thereof, the integrated circuit requiring connection to a power source, a power source package defining a cavity therein for carrying the radioisotope power source, the power source package having second contacts on an upper surface thereof contacting the first contacts and having third contacts on a lower surface thereof for contacting fourth contacts on the printed circuit board, the power source package having conductive vias extending from the second contacts on the upper surface of the power source package to the third contacts on the lower surface of the power source package, one or more of the vias having a fan-in segment, a fan-out segment and a substantially vertical segment therebetween, and electrical signals passing between the integrated circuit and the printed circuit board through the conductive vias and power passing from the radioisotope power source into the integrated circuit through one or more of the substantially vertical segments and the fan out segments.

SUMMARY OF INVENTION

The Applicant has realized that the art does not provide a satisfactory solution for providing a radioisotope power source that could be embedded directly in a semiconductor chip together with electronic components of an electronic device.

The Applicant has tackled the problem of devising an improved solution able to overcome these and others drawbacks of the prior art.

At the same time, the Applicant has tackled the problem of providing an embedded radioisotope power source by means of process steps substantially available in the standard CMOS (Complementary Metal Oxide Semiconductor) and MEMS (Micro Electro-Mechanical System) manufacturing processes.

One or more aspects of the solution according to various embodiments are set out in the independent claims, with advantageous features of the same solution that are indicated in the dependent claims.

An aspect of the solution according to one or more embodiments relates to an electronic device. The electronic device comprises: at least one electronic component formed in a chip of semiconductor material; at least one radioisotope power source unit comprising a radioactive material. The at least one radioisotope power source unit is embedded in the chip of semiconductor material together with the at least one electronic component. Moreover, the at least one radioisotope power source unit is arranged for providing electric power to said at least one electronic component by absorbing particles emitted by said radioactive material comprised in the least one radioisotope power source unit.

In an embodiment, the at least one radioisotope power source unit comprises a radioisotope cavity arranged for containing said radioactive material and a conversion arrangement arranged for absorbing particles emitted by said radioactive material and converting the energy associated with said particles in electric power.

In an embodiment, the conversion arrangement comprises a plurality of semiconductor diodes, particularly PIN diodes having a lateral structure and electrically connected in series.

In an embodiment, between consecutive PIN diodes of said plurality of PIN diodes a respective intervening intrinsic semiconductor portion is provided, each of said intervening intrinsic semiconductor portions serving as a platform for respective electrically conductive structures which electrically couple together said consecutive PIN diodes.

In an embodiment, a resulting surface of the conversion arrangement has a continuous, planar structure formed by the flushing surfaces of the PIN diodes and the intervening intrinsic portions.

In an embodiment, the radioisotope cavity comprises an opening reaching a surface of the conversion arrangement, the radioactive material contained in the radioisotope cavity being at least partly in contact with said surface of the conversion arrangement.

In an embodiment, the radioactive material is a material that emits particles due to radioactive decay process, and wherein the radiation cavity comprises a cavity having a bottom provided at a distance from a surface of the conversion arrangement lower than an absorption length associated with the particles emitted by the radioactive material.

In an embodiment, the at least one radioisotope power source unit is embedded in the semiconductor chip at a distance from the at least one electronic component, in the order of an absorption length associated with the particles emitted by the radioactive material.

In an embodiment, the at least one radioisotope power source unit is embedded in the semiconductor chip at a distance from the at least one electronic component equal to, or greater than, the 70% of an absorption length associated with the particles emitted by the radioactive material.

In an embodiment, the radioactive material is a material that emits β particles.

In an embodiment, the radioactive material comprises Tritium.

In an embodiment, the radioactive material comprises Promethium.

In an embodiment, said at least one electronic component comprises a memory element having a plurality of memory cells, and said at least one radioisotope power source unit is arranged for providing at least part of the electric power required by said memory element for storing data.

In an embodiment, the at least one radioisotope power source unit is arranged for compensating a leakage current affecting memory cells of the memory element, thus ensuring a retention of data stored in the plurality of memory cells of the memory element.

In an embodiment, each memory cell of the plurality of memory cells comprises at least one transistor, and the at least one radioisotope power source unit is arranged to supply a voltage lower than an operating supply voltage and higher than a threshold voltage of the at least one transistor of the memory cell.

In an embodiment, the at least one radioisotope power source unit comprises a plurality of radioisotope power source units, and each one of the radioisotope power source units are embedded in the chip among the memory cells of the memory element and electrically connected to at least one of said memory cells of the memory element for providing electric power thereto.

In an embodiment, the memory cells of the memory elements are arranged in rows and columns forming a memory matrix, and the plurality of radioisotope power source units is arranged in a plurality of strip lines, each of said strip lines being provided between a predetermined number of rows of the memory cells and/or a predetermined number of columns of the memory cells, said strip being electrically coupled with the memory cells delimited by said strip lines.

In an embodiment, the memory element is a Static Random Access Memory (SRAM).

In an embodiment, the electronic device is a Field Programmable Gate Array.

In an embodiment, the electronic component comprises a Micro-Electro-Mechanic System (MEMS) component.

Another aspect of the solution according to one or more embodiments proposes a method of forming an electronic device. The method comprises the following steps: forming at least one electronic component of the electronic device in a semiconductor chip, embedding in the semiconductor chip, together with said electronic components, a radioisotope power source unit adapted to provide electric power to said at least one electronic component by absorbing particles emitted by a radioactive material, said radioisotope power source unit comprising a radioactive material.

In an embodiment, said embedding comprises: forming a conversion arrangement of the radioisotope power source unit in a selected layer of the semiconductor chip, the conversion arrangement being adapted to provide electric power to said at least one electronic component by absorbing particles emitted by a radioactive material; forming a radioisotope cavity of the radioisotope power source unit by removing a portion of at least one layer formed on the selected layer and in correspondence of the conversion arrangement; providing the radioactive material in the radioisotope cavity.

In an embodiment, the step of forming a conversion arrangement in a selected layer of the semiconductor chip comprises forming said conversion arrangement in a semiconductor layer wherein doped semiconductor operating regions of said electronic components of the electronic device are formed as well.

In an embodiment, said selected layer of the semiconductor chip is formed over an insulating material layer, particularly a Bottom Oxide layer of the semiconductor chip, the semiconductor chip preferably being a SOI semiconductor chip.

In an embodiment, the step of forming a conversion arrangement in a selected layer of the semiconductor chip, comprises forming said conversion arrangement in a polysilicon layer wherein polysilicon operating regions of said electronic components of the electronic device are formed as well, said polysilicon layer being preferably formed on an isolating oxide layer of the semiconductor chip.

In an embodiment, the step of forming a radioisotope cavity by removing a portion of at least one layer formed on the selected layer and in correspondence of the conversion arrangement comprises removing a portion of at least one layer in order to have a bottom of the radioisotope cavity at a distance from a surface of the conversion arrangement lower than an absorption length associated with the particles emitted by the radioactive material In an embodiment, the step of providing the radioactive material in the radioisotope cavity comprises providing radioactive material in the radioisotope cavity in liquid phase and dehydrating the radioisotope in liquid phase, or sputtering the radioactive material in the radioisotope cavity, or depositing the radioactive material in the radioisotope cavity by means of a chemical vapour deposition process.

A further aspect of the solution according to one or more embodiments relates to an electronic device (e.g., a non volatile memory element, such as Non-Volatile Static Random Access Memory—NV-SRAM) comprising an embedded radioisotope power source distributed over at least a portion of the electronic device rather than being concentrated in a specific area thereof.

A further aspect of the solution according to one or more embodiments relates to a Non-Volatile memory element (e.g., a NV-SRAM) comprising an embedded radioisotope power source able to compensate for leakage currents affecting memory cells of the Non-Volatile memory element in order to improve a data retention capability thereof.

A further aspect of the solution according to one or more embodiments relates to electronic sensing element (e.g., comprising Micro Electro-Mechanic System—MEMS—components) comprising the embedded radioisotope power source of above.

BRIEF DESCRIPTION OF THE ANNEXED DRAWINGS

These and other features and advantages of the present invention will be made apparent by the following description of some exemplary and non limitative embodiments thereof. For its better intelligibility, the following description should be read making reference to the attached drawings, wherein.

DETAILED DESCRIPTION OF PREFERRED EMBODIMENTS

Figure 1:
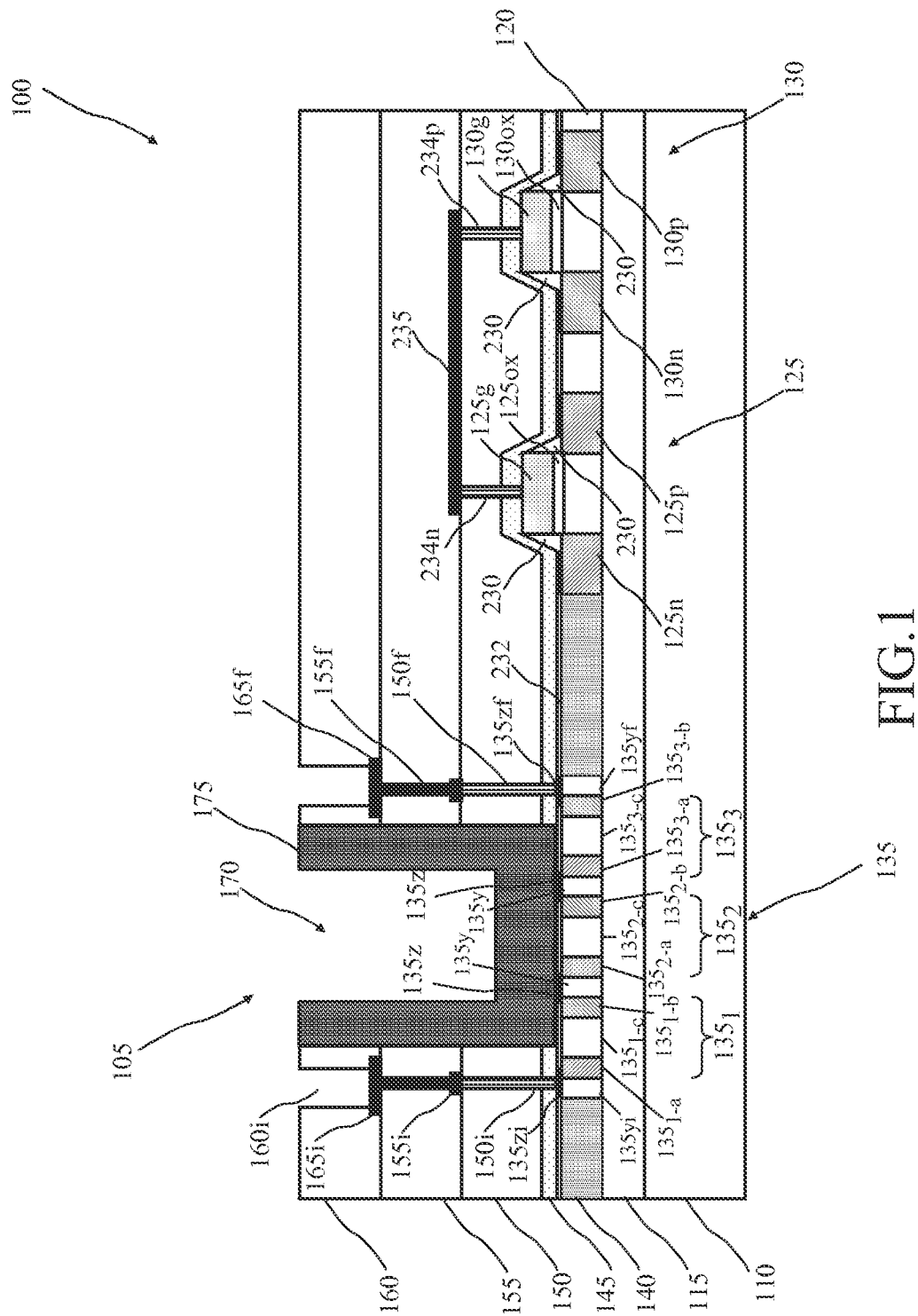
FIG. 1 is a schematic cross-sectional side view of an electronic device comprising an embedded radioisotope power source unit according to an embodiment.

With reference to the drawings, FIG. 1 is a schematic cross-sectional side view of an electronic device 100 comprising an embedded radioisotope power source unit 105 according to an embodiment.

In the non limitative example of FIG. 1, the electronic device 100 may be manufactured according to a CMOS (Complementary Metal Oxide Semiconductor) manufacturing process (as described in the following).

The electronic device 100 is formed on a chip of semiconductor material.

The semiconductor chip comprises a substrate layer 110, for example made of p-type (i.e., doped with boron) Silicon (Si).

Preferably, over the substrate layer 110 a Bottom Oxide layer, or BOX layer 115, is provided, for example according to the known Silicon On Insulator (SOI) technology process. The BOX layer 115 may comprise Silicon Oxide ($SiO_2$), although in other embodiments different insulating material may be used as well (e.g., comprising but not limited to Silicon Nitride (SiN), carbon doped oxide (CDO), oxynitrides, and low-k dielectrics).

The BOX layer 115 advantageously insulates the substrate layer 110 and electronic components (described in the following) provided in the upper layers of the electronic device 100, therefore reducing interferences between such electronic components, leading to a better efficiency of the whole electronic device 100 operation.

Over the BOX layer 115, a semiconductor layer 120 is provided. Preferably, a plurality of electronic components, two of which are visible in FIG. 1, i.e., a NMOS transistor 125 and a PMOS transistor 130, are formed in the semiconductor layer 120 for forming an operating circuitry of the electronic device 100.

The NMOS transistor 125 and the PMOS transistor 130 have a known structure obtained by means of process steps belonging to the well-known CMOS manufacturing process, and their description is not herein further detailed for the sake of brevity and conciseness.

In an embodiment, a conversion arrangement 135 of the embedded radioisotope power source unit 105 is provided.

The conversion arrangement 135 absorbs energy radiated through emitted particles by a radioactive material comprised in the embedded radioisotope power source unit 105 (as described in the following) and converts it in electric power exploitable by the electronic components, such as for example the NMOS transistor 125 and a PMOS transistor 130, of the electronic device 100. To this extent, for example the conversion arrangement 135 provides an electric voltage and an electric current exploitable by the at least part of the electronic components of the electronic device 100.

In an embodiment, the conversion arrangement 135 comprises a plurality of semiconductor diodes, preferably PIN diodes 135$x$ (with $x=1, \ldots, X$; $X=3$ in the non-limiting example of FIG. 1).

The conversion arrangement 135 may be provided according to the teachings of U.S. Pat. No. 8,344,468 which is hereby incorporated by reference.

Particularly, each generic PIN diode 135$x$ of the conversion arrangement 135 preferably comprises laterally-aligned and spaced-apart P+ (e.g., Silicon doped with Boron) and N+ (e.g., Silicon doped with Phosphorus) doped regions in which the associated P+ and N+ dopant (e.g., Boron and Phosphorus, respectively) has diffused entirely through the respective semiconductor layer portion. For example, each generic PIN diode 135$x$ is formed by a P+ doped region 135$x$-$a$, a N+ doped region 135$x$-$b$, an intrinsic region 135$x$-$c$ that is disposed between P+ doped region 135$x$-$a$ and N+ doped region 135$x$-$b$.

Preferably, the P+ dopant (e.g., Boron) is diffused entirely in P+ doped region 135$x$-$a$; i.e., from an upper surface portion of the P+ doped region 135$x$-$a$ spaced apart from the BOX layer 115 to a corresponding lower surface portion of the P+ doped region 135$x$-$a$ substantially adjacent to the BOX layer 115.

Similarly, the N+ dopant (e.g., Phosphorus) is diffused entirely through N+ doped region 135$x$-$b$; i.e., from an upper surface portion of the N+ doped region 135$x$-$b$ spaced apart from the BOX layer 115 to a corresponding lower surface portion of the N+ doped region 135$x$-$b$ substantially adjacent to the BOX layer 115.

The intrinsic region 135$x$-$c$, conversely, comprises substantially intrinsic (i.e., non doped) semiconductor material (e.g., Si).

With this arrangement, the P+ doped region 135$x$-$a$ is entirely separated from the N+ doped region 135$x$-$b$ by the intrinsic region 135$x$-$c$, thereby forming a lateral PIN diode structure.

The plurality of PIN diodes 135$x$ of the conversion arrangement 135 are sequentially arranged one with respect to the other (i.e., connected in an unbroken sequence extending in the longitudinal direction).

In detail, the PIN diodes 135$x$ of the conversion arrangement 135 are connected in series thanks to their lateral structure and, preferably, thanks to conductive structures 135$z$ (e.g., salicide butted contacts) described in the following.

Preferably, although not strictly necessarily, between couples of consecutive generic PIN diodes 135$x$ and 135($x$+1), the conversion arrangement 135 also comprises an intervening intrinsic portion 135$y$.

Advantageously, the resulting surface of the conversion arrangement 135 has a continuous, planar structure formed by the flushing upper surfaces of the PIN diodes 135 (i.e., the upper surfaces of the P+ doped region 135$x$-$a$, the N+ doped region 135$x$-$b$, the intrinsic region 135$x$-$c$) and of the intervening intrinsic portion 135$y$.

In an embodiment, the upper surface of intervening intrinsic portion 135$y$ serves as a convenient bridge (platform) for respective electrically conductive structures 135$z$ that electrically couple together consecutive PIN diodes 135$x$ and 135($x$+1), preferably by using standard metallization techniques (e.g., by means of salicidation).

In other words, electrically conductive structures 135$z$ are respectively patterned on intervening intrinsic portions 135$y$ and on at least a small part of the upper surface portions of the P+ doped region 135*x-a* of the generic PIN diode 135*x* and on the N+ doped region 135(*x*+1)-*b* of the adjacent PIN diodes 135(*x*+1) in order to provide an electrical coupling between the adjacent PIN diodes 135*x*.

In an alternative embodiment (not shown), intervening intrinsic portions 135*y* may be omitted and a sequence of PIN diodes may be formed by using adjacent N+ regions 135*x-b* and P+ regions 135(*x*+1)-*a*.

By using such a structure featuring PIN diodes sequences, N+-P+ tunnel junctions are formed. Advantageously, the N+-P+ tunnel junctions formed by adjacent N+ regions 135*x-b* and P+ regions 135(*x*+1)-*a* have low resistivity in this alternative embodiment with respect to the resistivity of the electrically conductive structures 135*z*.

In this way, all the PIN diodes 135*x* of the conversion arrangement 135 are electrically connected in series. In this way, a requested voltage value Vr to be fed to (at least part of) the electronic components of the electronic device 100 may be obtained as the sum of voltages provided by each one of the PIN diodes 135*x* connected in series.

It should be noted that the structure of the conversion arrangement 135 is advantageous since it allows obtaining the requested voltage value Vr without the need to implement a voltage converter such as a charge pump, thus saving space and simplifying the design of the electronic device 100.

At the two ends of the series of PIN diodes 135*x* end intrinsic portions 135*yi* and 135*yf* are provided, and over which contact electrically conductive structures 135*zi* and 135*zf*, respectively, are patterned, to serve as contact terminals of the conversion arrangement 135.

It should be noted that a longitudinal length L of the conversion arrangement 135 is generally determined by the number of PIN diodes 135*x*, in their turn depending on the requested voltage value Vr, connected in series plus the intervening intrinsic portions 135*y* interposed among them.

For example, the P+ doped region 135*x-a* and N+ doped region 135*x-b* have both a longitudinal length preferably comprised between 0.5 µm and 5.5 µm, more preferably comprised between 1 µm and 5 µm. The intrinsic region 135*x-c* has a longitudinal length preferably comprised between 1 µm and 100 µm, more preferably comprised between 5 µm and 50 µm. The intervening intrinsic portion 135*y* has a longitudinal length preferably comprised between 0.0 µm (i.e., when omitted) and 10 µm, more preferably comprised between 0 µm and 5 µm. Therefore each generic PIN diode 135*x* has a length ranging between 7 µm and 115.5 µm, more preferably between 1 µm and 65 µm.

Similarly, a lateral width W of the conversion arrangement 135 is determined by a desired current Ir. In an embodiment a lateral width W comprised between 50 µm and 3 mm is selected, such as for example a width W of 2.3 mm.

The thickness T of the conversion arrangement 135 is substantially dependent on the materials and on the manufacturing processes exploited in the production of the conversion arrangement 135. In an embodiment, the conversion arrangement 135 comprises a thickness comprised between 1 µm and 5 µm. It should be noted that the conversion arrangement 135 just described can be easily manufactured by means of standard processes (e.g., comprised in the CMOS manufacturing process, and Micro-Electro-Mechanical System (MEMS) manufacturing process) without requiring any (or requiring very few) additional masks (as described in the following).

Insulating spacers portions 140 may be provided between the electronic components of the electronic device 100 and the conversion arrangement 135 of the radio isotope power source 105 in order to provide an enhanced electrical insulation therebetween.

For example, the insulating spacers portions 140 may be formed by means of a Shallow Trench Insulation (STI) process available in the CMOS manufacturing process or similar processes.

In an embodiment, over the semiconductor layer 120, an (insulating) etch stop layer 145 is preferably provided. For example, the stop layer 145 is made of Silicon Nitride (SiN).

Over the semiconductor layer 120 and the etch stop layer 145 (if provided), a Pre-Metal-Dielectric layer, or PMD layer 150 made of an insulating material (e.g., Silicon Oxide, Phosphosilicate Glass PSG—or Borophosposilicate Glass—BPSG) is provided. In the PMD layer 150, contact portions (e.g., made of an electrically conductive element such as Tungsten W) are provided in order to couple terminal of electronic components in the semiconductor layer with conductive elements (e.g., metal layer or vias) provided in upper metallization layers (described in the following).

Preferably, the radioisotope power source unit 105 comprises two (electric) contact elements 165*i* and 165*f* in the PMD layer 150. The contact elements 165*i* and 165*i* extend for the whole thickness of the PMD layer 150 and through the stop layer 145 (if provided) and are connected to the electric contact elements 135*zi* and 135*zf*, respectively, in order to allow coupling the conversion arrangement 135 with conductive elements (e.g., metal layer or vias) provided in the upper metallization layers (described in the following).

Above the PMD layer 150, one or more metallization layers may be provided. Each metallization layer comprises electrically conductive lines and vias made of metal materials (e.g., copper, aluminium) arranged to electrically couple together and/or to external contact pads the electronic components of the electronic device 100 in order to form a desired electronic circuit and/or allow an electric coupling with e.g., wire bondings and package leads (not shown), in order to couple with other electronic devices (not shown).

The conductive lines and vias are surrounded by insulating material (e.g., Silicon Oxide); particularly conductive lines extend themselves along the length and the width of the metallization layer, while the conductive vias extend themselves along the thickness of the metallization layer.

In the example of FIG. 1, a single metallization layer 155 (also denoted as M1) is provided.

Preferably, the radioisotope power source unit 105 comprises two conductive vias 155*i* and 155*f* in the metallization layer 155. The conductive vias 155*i* and 155*f* are coupled with the contact elements 150*i* and 150*f*, respectively. The conductive vias 155*i* and 155*f* extend for the whole thickness of the metallization layer 155.

Eventually, the electronic devices 100 comprises a passivation layer 160 provided above the metallization layer 155. The passivation layer 160 is made of an insulating material (e.g. Silicon Oxide) and has the purpose to electrically and mechanically insulate the lower layers of the electronic device 100 from the external environment.

Possibly, one or more apertures are provided in the passivation layer 160, and corresponding electric contact pads are provided therein, coupled with respective vias in order to allow an electric coupling with external electric coupling elements (such as wires and/or lead of a packaging, not shown). The electric contact pads are made of an electrically conductive material (e.g., aluminium).

In an embodiment, the radioisotope power source unit 105 comprises two openings 160i and 160f provided in the passivation layer 160. Moreover, within each one of the two openings 160i and 160f a respective electric contact pad 165i and 165f are provided.

The electric contact pad 165i and 165f are electrically coupled with the conductive vias 155i and 155f, respectively, thus an electric coupling between the radioisotope power source unit 105 and external electric coupling elements is possible.

Preferably, the radioisotope power source unit 105 is coupled with other electronic components of the electronic device 100 by means of electrically conductive lines (not shown) provided in the metallization layer 155 in addition (or as an alternative) to the electric contact pad 165i and 165f.

In an embodiment, the radioisotope power source unit 105 comprises a radioisotope via, or radioisotope cavity 170 that has the purpose to contain radioactive material 175 and, possibly, guide particles radiated by the radioactive material towards the conversion arrangement 135.

In an embodiment, the radioisotope cavity 170 comprises cavity extending from a free surface (i.e., facing the external environment, external to the electronic device 100) of the passivation layer 160, preferably, down to the upper surface of the conversion arrangement 135, passing through all the layers therebetween.

In this way, the radioactive material 175 is at least partly in direct contact with the upper surface of the conversion arrangement 135.

More generally, the radioisotope cavity 170 extends from a free surface of the passivation layer 160 through the lower layers down to a distance from the upper surface of the conversion arrangement 135, this distance being lower than the absorption length associated with the particles emitted by the radioactive material 175. In other words, a bottom of the radiation via 170 is at a distance from the upper surface of the conversion arrangement 135 lower than an absorption length associated with the particles emitted by the radioactive material 175.

In an embodiment, sidewalls 170s of the radioisotope cavity 170 may be coated by a radiation shielding material (not shown, for example Aluminum) suitable for preventing particles radiated by the radioactive material from reaching the 'sensitive' areas of the semiconductor chip, e.g. where the electronic components of the electronics device 100 are formed, sensitive to ionizing radiation emitted by the radioactive material 175.

In an embodiment, a radioactive material 175 that emits β particles as product of radioactive decay is selected. For example, the radioactive material 175 may comprise Tritium, which is a radioactive isotope (i.e., a radioisotope) of Hydrogen (H), or isotopes of or Promethium (Pm), which all are radioactive isotopes.

In the radioisotope power source unit 105 according to an embodiment, the conversion arrangement 135 is arranged to absorb β particles emitted by the radioactive material 175, and to convert energy associated with such β particles into electric power exploitable by at least a selected part of the electronic components of the electronic device 100.

In this case, the radioisotope power source unit 105 may be defined also as a betavoltaic power source and the conversion arrangement 135, as a betavoltaic arrangement.

Moreover, in this case the β particles have an absorption length of about 1.2 μm, therefore the radioisotope cavity 170 extends from the free surface of the passivation layer 160 through the lower layers until a distance from the conversion arrangement 135 lower than 1.2 μm. Preferably, the radioisotope 170 extends from the free surface of the passivation layer 160 to a distance lower than 1.2 μm from the lower surface (i.e., the surface in contact with the BOX layer 115) of the conversion arrangement 135.

Obviously, the electronic device 100, may comprise more than one radioisotope power source unit 105. Generally, the electronic device 100 comprise a plurality of radioisotope power source units 105, either interconnected or independent one from the other, or interconnected in a plurality of independent groups or clusters, in order to provide the required electric power to one or more electronic components of the electronic device 100 (even though nothing prevents from designing a single radioisotope power source unit 105 for providing power to the whole electronic device 100).

Moreover, The structure of the radioisotope power source unit 105 'buried' within the radioisotope cavity 170 formed on a same semiconductor chip in which the electronic device 100 is provided allows reducing parasitic radiation effects on 'sensitive' areas of the semiconductor chip, e.g. where the electronic components of the electronics device 100 are formed. Namely, the particles emitted by the radioactive material 170 are substantially absorbed in the proximity radioisotope cavity 170 (and in particularly, by the conversion arrangement 135) and are not able to reach the electronic components o the electronics device 100.

Thus, preferably, the radioisotope power source unit 105 is formed in the chip of semiconductor material at a distance from the 'sensitive' areas of the semiconductor chip equal to or greater than the 70%, such as the 80%, of the absorption length associated with the particles emitted by the radioactive material 175. For example, in case of Tritium the radioisotope power source unit 105 may be formed spaced apart from the 'sensitive' areas of the semiconductor chip by a length equal to, or greater than 1 μm.

The Applicant has found that by embedding a plurality of radioisotope power source unit 135 in separate areas of the electronic device 100 results in a reduced dishing effect, i.e., a concave shape taken by the surface of the electronic device 100, as known due to a Chemical Mechanical Polishing (CMP) process performed for remove unevenness from the electronic device 100 surfaces.

Having described the structure of the embedded radioisotope power source unit 105 according to an embodiment, a manufacturing method thereof, which is performed contextually with the manufacturing process of the rest of the electronic device 100, will be now described by making reference to the FIGS. 2A-2G, which are schematic views of some steps of the manufacturing process according to an embodiment.

In an embodiment, the electronic device 100 is implemented in a semiconductor chip belonging to a SOI wafer 200 comprising the substrate layer 110 and the BOX layer 115.

Figure 2A:
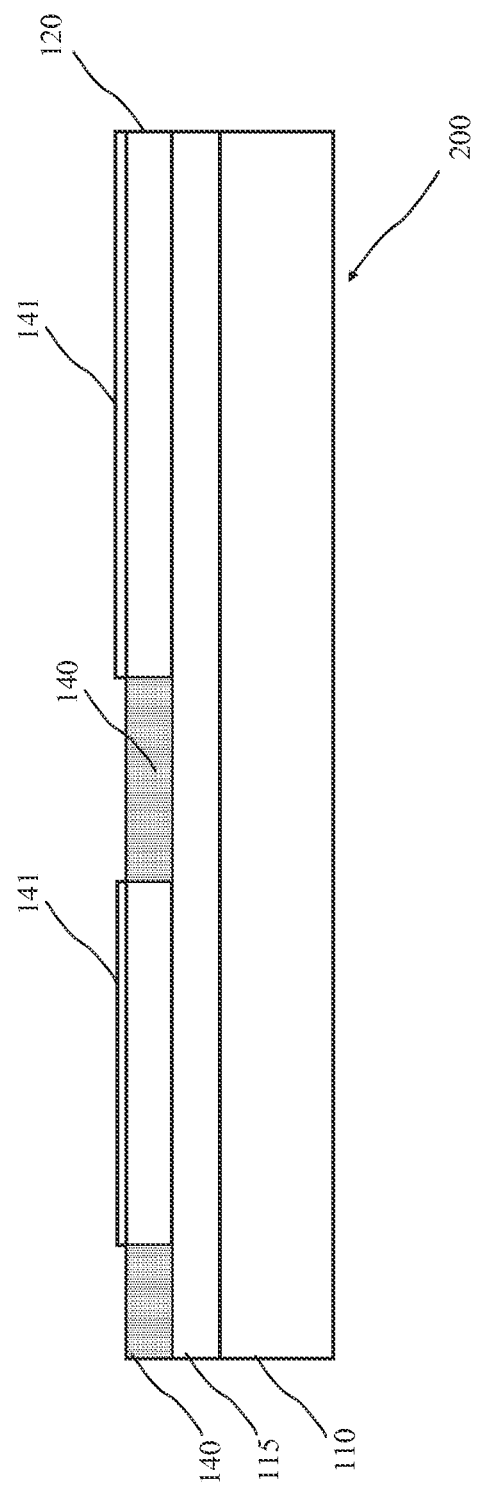
FIGS. 2A-2G are schematic views of some steps of a manufacturing process of an embedded radioisotope power source unit according to an embodiment.

With particular reference to FIG. 2A, the semiconductor layer 120 is formed over the BOX layer 115 e.g., by means of a Chemical Vapour Deposition (CVD) phase. For example, the semiconductor layer 120 is formed as a lightly P-type (p−) doped semiconductor layer (e.g. a doping comprised between $10^{13}$ dopant/cm$^{-3}$ and $10^{14}$ dopant/cm$^{-3}$) having a thickness comprised between 0.1 μm and 4 μm.

Then, preferably a photolithographic process is used to form the insulating spacers portions 140. A layer of photosensitive material, or resist (not shown), is deposited over the semiconductor layer 120. Portions of the resist, corresponding to a plan view of the insulating spacers portions 140 are defined by means of a photolitographic mask (not shown) and are subjected to the electromagnetic radiation (which passes through mask only in correspondence of the portion defined). The impressed portions of the resist are selectively removed (e.g., via a chemical etching) so as to leave exposed a portion of the surface of the semiconductor layer 120 corresponding to the plan view of the insulating spacers portions 140 to be formed. At this point, the insulating spacers portions 140 are formed, for example by means of an etching process, to define trenches, which are subsequently filled with insulating material for example by means of a Chemical Vapour Deposition step.

In this way the semiconductor regions for the conversion arrangement 135 and the electronic components, such as the NMOS transistor 125 and the PMOS transistor 130, of the electronic device 100 are delimited by the insulating spacers portions 140.

Preferably, a sacrificial oxide layer 141 (e.g., made of $SiO_2$) may be grown over the semiconductor regions where the conversion arrangement 135 and the electronic components are to be formed.

Figure 2B:
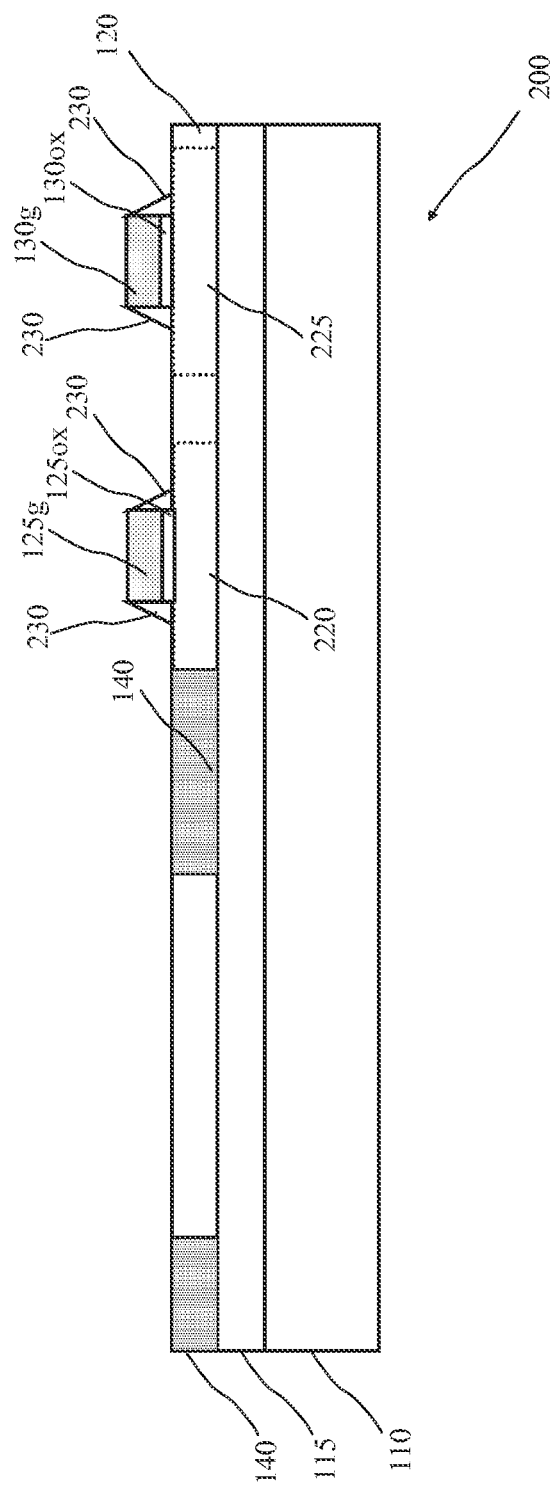

With particular reference to FIG. 2B, a Gate OXides (GOX) 125ox and 130ox for the NMOS transistor 125 and the PMOS transistor 130, respectively, may be formed e.g., by a photolithographic process (in a similar way as described above) followed by a respective Chemical Vapour Deposition (CVD).

After this step, N wells and P wells are then formed in the semiconductor layer 115. For example, a N well 220 (i.e., a region with a predetermined N-type doping, e.g. comprised between $10^{13}$ dopant/cm$^{-3}$ and $10^{15}$ dopant/cm$^{-3}$) for the PMOS transistor 130 and a P well 225 (i.e., a region with a predetermined P-type doping, e.g., comprised between $10^{13}$ dopant/cm$^{-3}$ and $10^{15}$ dopant/cm$^{-3}$) for the NMOS transistor 125 may be sequentially formed, as known, by respective ion implantation processes.

It should be noted that the conversion arrangement 135 of the radioisotope power source unit 105 does not require any N-type or P-type well.

Afterwards, polysilicon operating regions of the electronic device 100 are formed. For example, gate regions 125g and 130g of the NMOS transistor 125 and of the PMOS transistor 130, respectively, may be formed e.g., by a photolithographic process (in a similar way as described above) followed by a respective Chemical Vapour Deposition over the respective GOXs 125ox and 130ox.

Additionally, dielectric spacers 230 may be formed at sidewalls of the gate regions 125g and 130g for example by means of an oxidation process (e.g., thermal oxidation, or CVD oxide deposition and etchback)

Figure 2C:
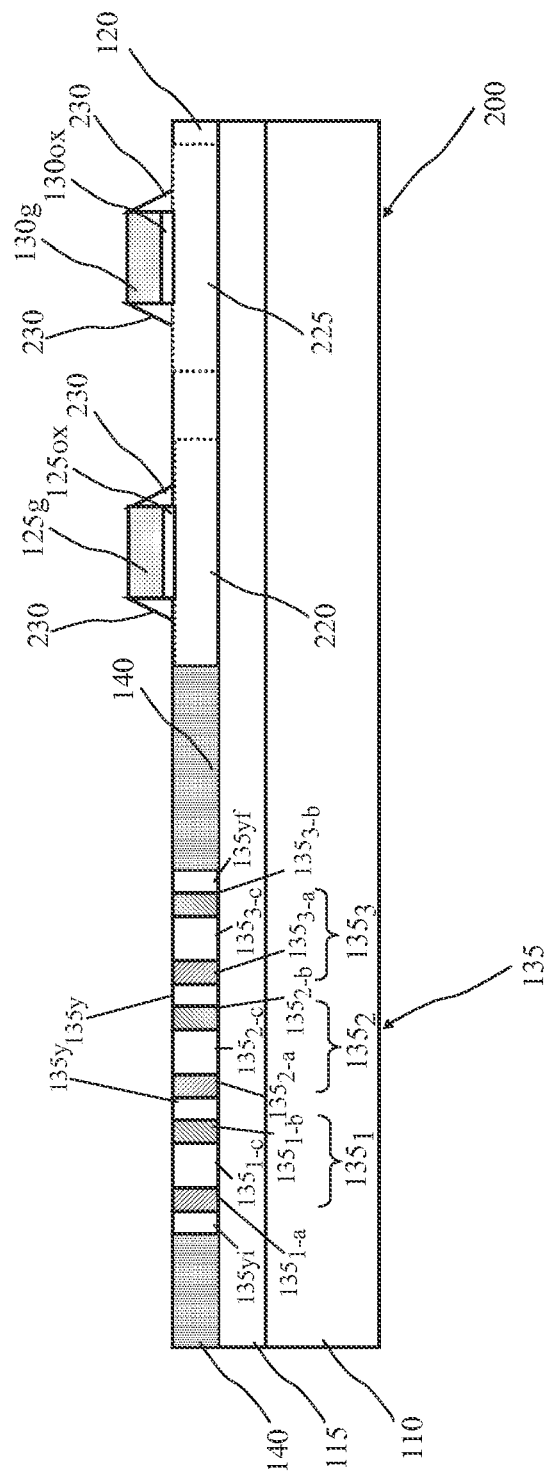

With particular reference to FIG. 2C, semiconductor operating regions of the conversion arrangement 135 are formed.

In an embodiment, the semiconductor operating regions of the conversion arrangement 135 are initially formed. Namely, all the P+ doped regions 135x-a and all the N+ doped regions 135x-b of the conversion arrangement 135 are formed by ion implantation (e.g., with a doping dose comprised between $10^{14}$ dopant/cm$^{-2}$ and $10^{16}$ dopant/cm$^{-2}$) in the desired areas of the semiconductor layer 150 selected by means of respective photolithographic masks (i.e., a mask for defining the P+ doped regions 135x-a and a further mask for defining the N+ doped regions 135x-b). Preferably, an annealing step is performed in order to ensure that the dopants within the P+ doped regions 135x-a and the N+ doped regions 135x-b are evenly diffused for the whole thickness thereof (from the upper surface to the lower surface in contact with the BOX layer 115).

It should be noted that the operating regions of the conversion arrangement 135 are formed before the operating regions of the electronic components of the electronic device 100 in order to avoid that the just described annealing step could cause damage to the structures of the operating regions of the electronic components of the electronic device 100.

Figure 2D:
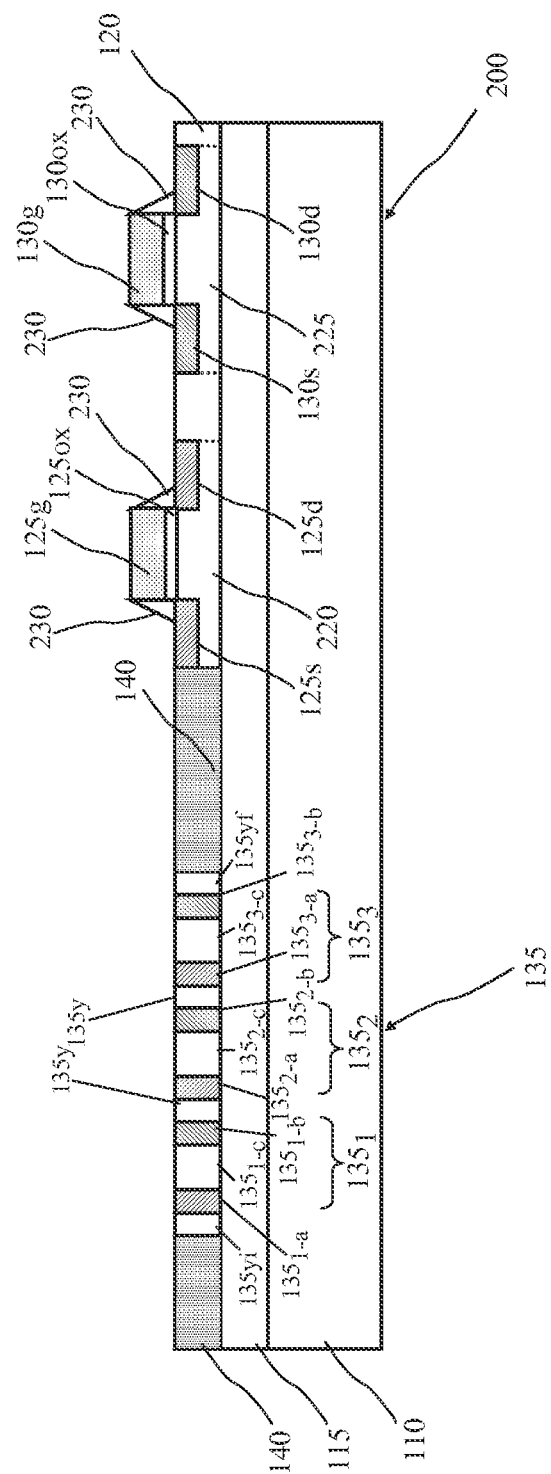

With particular reference to FIG. 2D, semiconductor operating regions of the electronic components of the electronic device 100 are formed after fabrication of the conversion arrangement 135.

Afterwards, semiconductor operating regions of the electronic components of the electronic device 100 are defined by the so called NLDD—N Lightly Doped Drain—and PLDD—P Lightly Doped Drain—implants (e.g. with doses comprised between $10^{13}$ dopant/cm$^{-2}$ and $10^{15}$ dopant/cm$^{-2}$) and heavier (up to $10^{16}$ cm$^{-2}$) source/drain implants by means of ion implantation. For example, a drain region 125d and a source region 125s of the NMOS transistor 125 and a drain region 130d and a source region 130s of the PMOS transistor 130 are defined by combinations of LDD and source/drain implants.

Subsequently, the semiconductor operating regions of the electronic components of the electronic device 100 may be completed by corresponding implants (i.e., by means of an ion implantation step).

Figure 2E:
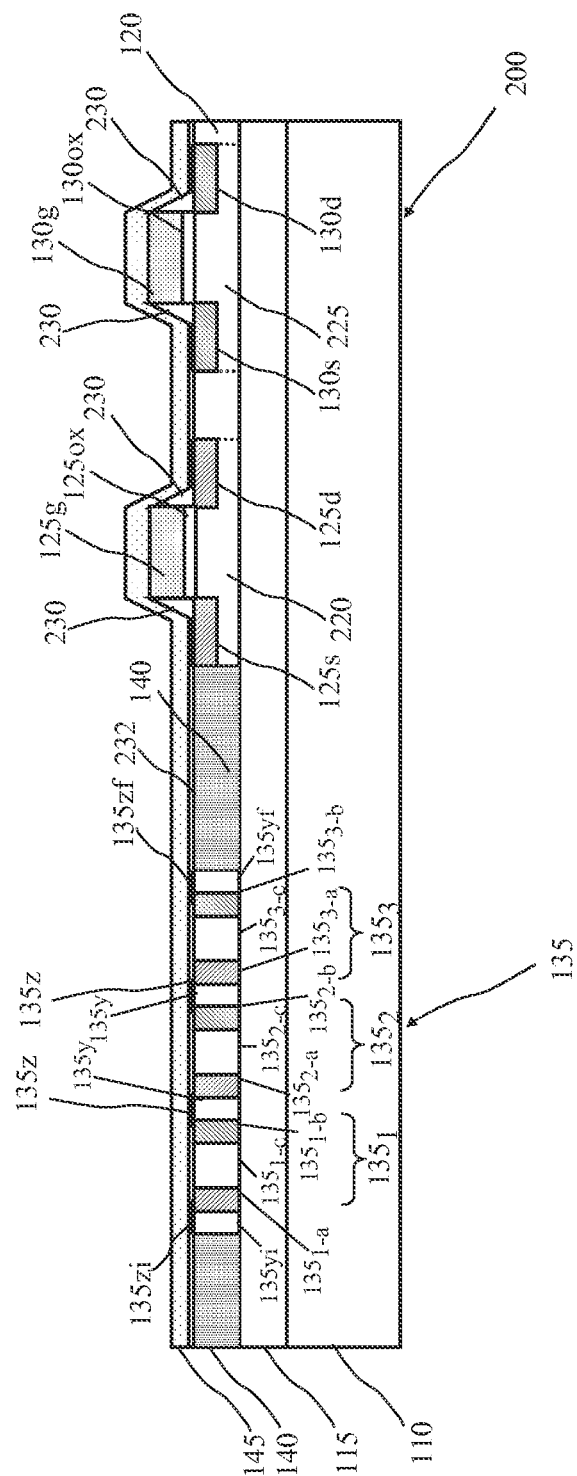

With particular reference to FIG. 2E, preferably, a layer of insulating material also called No-SAL layer 232 (for blocking the formation of salicide layer) is formed over the semiconductor layer 120 (e.g., by a step of CVD oxide). In the No-SAL layer 232 apertures are then formed (e.g., by means of dry chemical etching); such apertures are provided in the regions of the conversion arrangement 135 and of the electronic components of the electronic device 100 that are to be electrically coupled with, e.g., other electronic components of the electronic devices.

Thus, by means of a salicidation step a salicide (e.g., comprising a transition metal such as for example Cobalt (Co)) is provided in the apertures just described. The salicide facilitate a subsequent electrical connection with metal elements for electrical connection formed later in higher layers of the semiconductor chip.

In the embodiment, by means of the just described salicidation step the electrically conductive structures 135z, 135zi and 135zf of the conversion arrangement 135 are formed as well as contact terminals for the drain region 125d and the source region 125s of the NMOS transistor 125 and the drain region 130d and the source region 130s of the PMOS transistor 130.

Afterwards, the etch stop layer 145 is formed. The etch stop layer 145 is made of an insulating material, for example Silicon Nitride (SiN) that is grown over the No-SAL layer 230 for example by means of a CVD step.

Figure 2F:
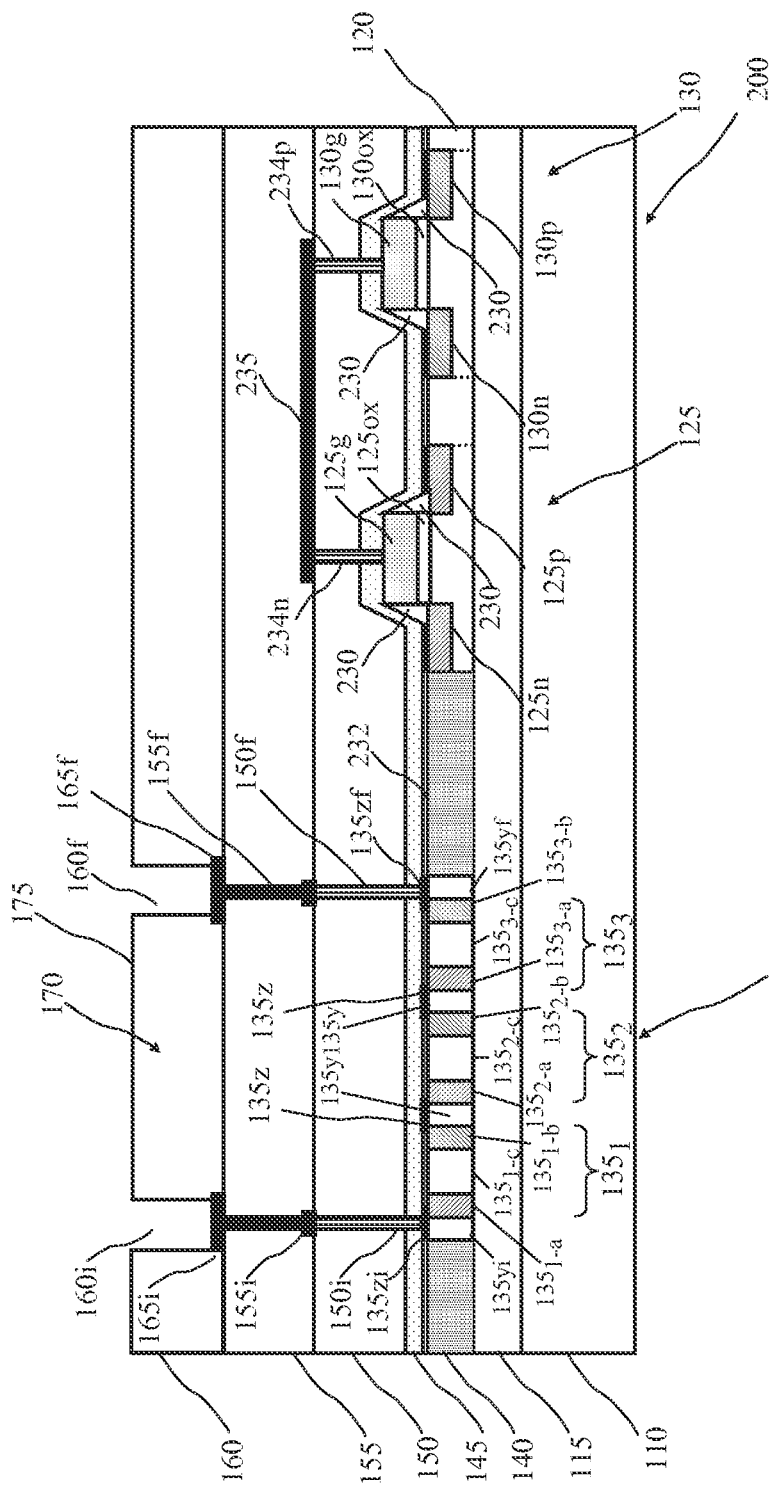

With particular reference to FIG. 2F, the PMD layer 150 made of insulating material is formed for example by means of a CVD step.

Then, contact openings are provided e.g. by means of an etching step in order to reach the electrically conductive structures 135z, 135zi and 135zf of the conversion arrangement 135 and contact terminals for the gate region 125g, the drain region 125d and the source region 125s of the NMOS transistor 125 and the gate region 130g, the drain region 130d and the source region 130s of the PMOS transistor 130.

The contact openings in the PMD layer 150 are filled with an electrically conductive element, such as Tungsten (W), in order to form the above-mentioned contact portions provided in order to couple contact terminals of electronic components in the semiconductor layer with conductive elements (e.g., metal layer or vias) provided in upper metallization layers.

With the just described steps, the contact elements 150*i* and 150*f* of the radioisotope power source unit 105 are particularly provided as well as contact elements 234*n* and 234*p* for the gate region 125*g* and 130*g* of the transistors 125 and 130, respectively.

Above the PMD layer 150, the metallization layer 155 is provided. Metal lines 235 (e.g., made of aluminium) are formed and patterned by means of a photolithographic step and an etching step (similarly as described above). For example a metal line 235 coupled with the contact elements 234*n* and 234*p* is formed.

Then the insulating material of the metallization layer 155 is formed, e.g. by means of a CVD step. The insulating material of the metallization layer 155 is then selectively etched, e.g. photolithographic step and an etching step (similarly as described above), in order to provide openings that are filled with a metal (e.g., aluminium) in order to form the desired vias, such as the two conductive vias 155*i* and 155*f* of the radioisotope power source unit 105.

In the exemplary radioisotope power source unit 105, the two conductive vias 155*i* and 155*f* are coupled with the contact elements 234*n* and 234*p*.

Subsequently, on top of the metallization layer 155 electrical contact pads, such as the electric contact pad 165*i* and 165*f* of the radioisotope power source unit 105, are formed and patterned by means of a photolithographic step and an etching step (similarly as described above).

The passivation layer 160 is formed for example by means of a CVD step (similarly as described above), and then openings, such as for example the openings 160*i* and 160*f*, are formed and patterned by means of a photolithographic step and an etching step (similarly as described above) in correspondence of the electrical contact pads.

Figure 2G:
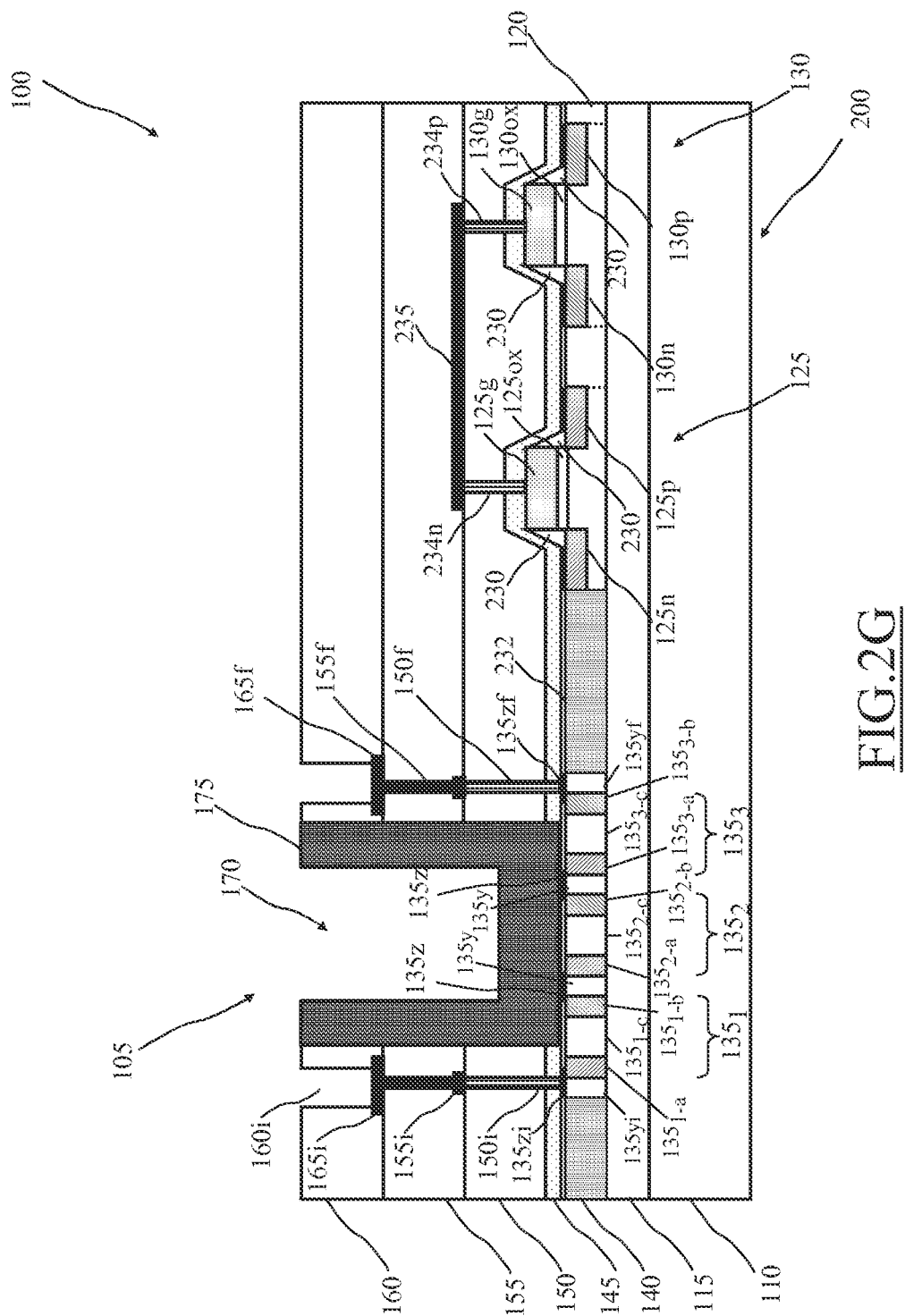

With particular reference to FIG. 2G, in the embodiment the radioisotope cavity 170 is formed.

In an embodiment, the radioisotope cavity 170 is formed substantially through similar steps used for forming the via wave guide described in U.S. Pat. No. 7,678,603 which is hereby incorporated by reference.

It should be noted that, in contrast with U.S. Pat. No. 7,678,603, there are no special requirements for the construction of the sidewalls of the radioisotope cavity 170 since the radioisotope cavity 170 is not used as a waveguide for light, but has the aim to bring the radioactive material closer to the conversion arrangement 135.

Particularly, the passivation layer 160, the metallization layer 155, the PMD layer 150, and the stop layer 145 are selectively etched (e.g., by means of photolithographic and etching steps), exposing the upper surface of the conversion arrangement 135.

Possibly, sidewalls of the radioisotope cavity 170 may be coated with a radiation shielding material (e.g., Aluminum) in order to prevent the dispersion of stray particles out of the radioisotope cavity 170 particularly into the passivation layer 160, the metallization layer 155, the PMD layer 150, and the semiconductor layer 120.

Afterwards, the radioactive material 175 is provided in the radioisotope cavity 170. The radiation material may be introduced in the radioisotope cavity 170 in a liquid phase (e.g., with a LiF/T solution which is then dehydrated) by means of a sputtering step (e.g., with tritated polymer) or by means of a CVD (e.g., with a-Si:T:H precursor) step.

Preferably, the radioactive material 175 is at least partly deposited directly on the (exposed) upper surface of the conversion arrangement 135.

According to an embodiment, the provision of the radioactive material 175 may be performed after dicing of the electronic device 100 from the wafer 200.

According to a further embodiment, the provision of the radioactive material 175 may be performed after the packaging of the electronic device 100 in a open-lid type package.

Afterwards, any excess radioactive material 175 is removed from the passivation layer 160 surface and from the electrical contact pads 165*i* and 165*f*.

In an embodiment, the electronic components of the electronic device 100 are designed according to the known Radiation-Hard By Design (RHBD) rules that ensures an improved robustness and reliability of the electronic components against particles (such as the β particles mentioned above) emitted by the radioactive material 175.

The Applicants have found that Tritium (used as radioactive material 175) and having half-life of about 12 years and average energy of emitted electrons (i.e., the β particles) of 5.7 keV average allows to exclude radiation damage of CMOS components of the chip during the electronic device 100 life time. Therefore, RHBD rules may be applied in a non-strict manner and/or alternative manufacturing solution may be implemented in order to avoid Total Ionizing Dose (TID) detrimental effects on the whole structure of the electronic device 100, and in particular on silicon oxides layers comprised in the electronic device 100, such as shallow-trench isolation oxides, which withstand the influence associated with the β particles emitted by the Tritium in view of the fact that the absorption length of such β particles is about 1.2 μm for silicon and silicon oxides.

Conversely, the Applicants have found that the isotope Promethium 147 having a half life of about 17 years and emits electrons with the energy up to 225 keV. Therefore, in an electronic device 100 comprising Promethium 147 used as radioactive material 175, special radiation hardening of the CMOS components on the chip may be required.

Figure 3:
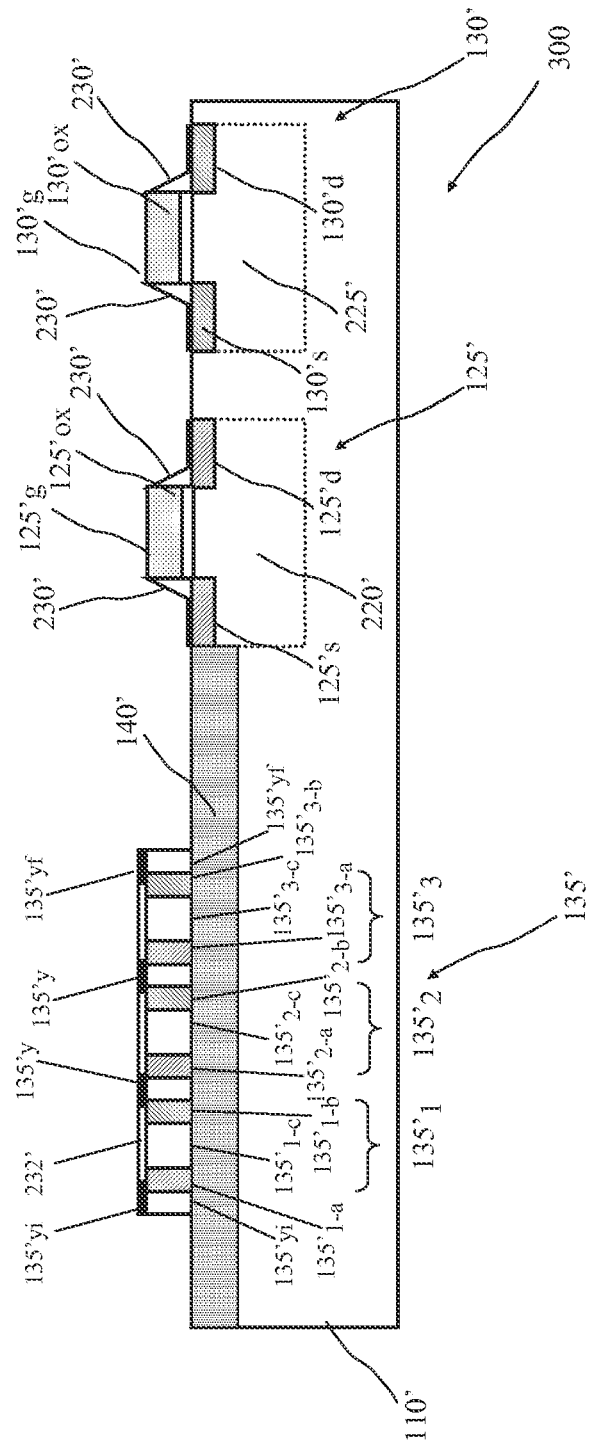
FIG. 3 is a schematic view of a step of an alternative manufacturing process of an embedded radioisotope power source unit according to an alternative embodiment.

An alternative electronic device comprising an embedded radioisotope power source unit according to an embodiment may be manufactured starting from a simple Silicon wafer (i.e., comprising only a silicon substrate) rather than the SOI wafer as described above, for example as shown in FIG. 3, which is a schematic view of a step of an alternative manufacturing process of an embedded radioisotope power source unit according to an embodiment exploiting a wafer comprising only a Silicon substrate 300.

The alternative manufacturing process differs from the manufacturing process described above in what follows (wherein similar references denote similar entities whose description is not herein repeated for the sake of brevity).

In the alternative electronic device, the electronic components, such as NMOS transistor 125' a PMOS transistor 130' are manufactured (substantially with similar steps as described above) directly in the Silicon substrate 300.

In correspondence of the portion of the alternative electronic device where the conversion arrangement 135' has to be provided a large insulating portion 140' (e.g., STI) is formed. On an upper surface of the large insulating portion 140' the whole conversion arrangement 135' is formed (with similar process steps as described above).

Thus, in the alternative electronic device, the conversion arrangement 135' is formed at a different layer from the layer in which are formed the semiconductor operating regions of the electronic components of the alternative electronic device (e.g., a drain region 125*d'* and a source region 125*s'* of the NMOS transistor 125' and a drain region 130*d'* and a source region 130*s'* of the PMOS transistor 130').

Preferably, the conversion arrangement 135' is formed substantially at the same level in which the polysilicon of the electronic components of the alternative electronic device is formed (e.g., gate regions 125*g'* and 130*g'* of the NMOS transistor 125' and of the PMOS transistor 130', respectively) such level is often referred to as a 'polysilicon layer' of the electronic device 100. In the alternative electronic device the conversion arrangement 135' has a thickness between 0.1 µm and 1 µm, preferably comprised between 0.2 µm and 0.3 µm.

It should be noted that the alternative manufacturing process just described does not requires additional masks with respect to the core CMOS manufacturing process.

Obviously, the process steps described above may be repeated or performed in parallel (e.g., with shared photolitographic masks) in order to provide a plurality of radioisotope power supply 105 (either in series, in parallel or independent one from the other) in the electronic device 100 according to any specific requirements.

The radioisotope power source unit 105 according to an embodiment may simply be embedded in a plurality of electronic device, thanks to the fact that the radioisotope power source unit 105 may be implemented by means of standard CMOS and MEMS manufacturing processes with the addition of very few process steps and/or photolitographic masks. Therefore, the radioisotope power source unit 105 according to an embodiment may be embedded in substantially any electronic device 100 in a reliable and cost-effective manner, without requiring substantial changes to the manufactory process used in a foundry that manufactures the electronic device 100.

Advantageously, the radioisotope power source unit 105 according to an embodiment may be embedded in a great variety of electronic devices in order to supply power to at least a part of the electronic components thereof.

The radioisotope power source unit 105 is particularly suited for low power or ultra low power applications (e.g., for providing power in the order of tens-hundreds of nanoWatts for practical areas of the radioisotope power source unit 105—such as for example, about 1 nW for 2.3 mm×1.5 mm radioisotope power source unit 105), even though radioisotope power source unit 105 arranged for providing different power ranges are not excluded.

The radioisotope power source unit 105 according to an embodiment is well suited for (but not limited to) electronic devices in which batteries are not easily accessible, or in which a power circuitry and a battery would occupy an excessive space, or else in which a power circuitry and a battery would be too expensive.

For example, the radioisotope power source unit 105 according to an embodiment may be embedded in sensing nodes of a so called 'Internet of Things' (IoT) network, which usually comprise a very large number of sensing nodes distributed over very large areas (worldwide). Thanks to the radioisotope power source unit 105, such sensing nodes could operate for many years without requiring periodic battery changes that would be very time consuming and costly.

Moreover, the radioisotope power source unit 105 according to an embodiment may be embedded in electronic devices comprising MEMS components for directly powering such MEMS components in a efficient and cost-effective manner.

Also, the radioisotope power source unit 105 according to an embodiment may be embedded in a System on Chip (SoCs) and designed in order to supply the power for the whole SoC.

Moreover, the radioisotope power source unit 105 may be provided in different integrated circuits, such as for example in a Field Programmable Gate Array (FPGA) for supplying power thereto, or at least to one or more memory blocks of the FPGA (e.g., for ensuring retention of the encryption keys (used, as known, for operating bitstreams encryption and authentication in the FPGA).

Figure 4A:
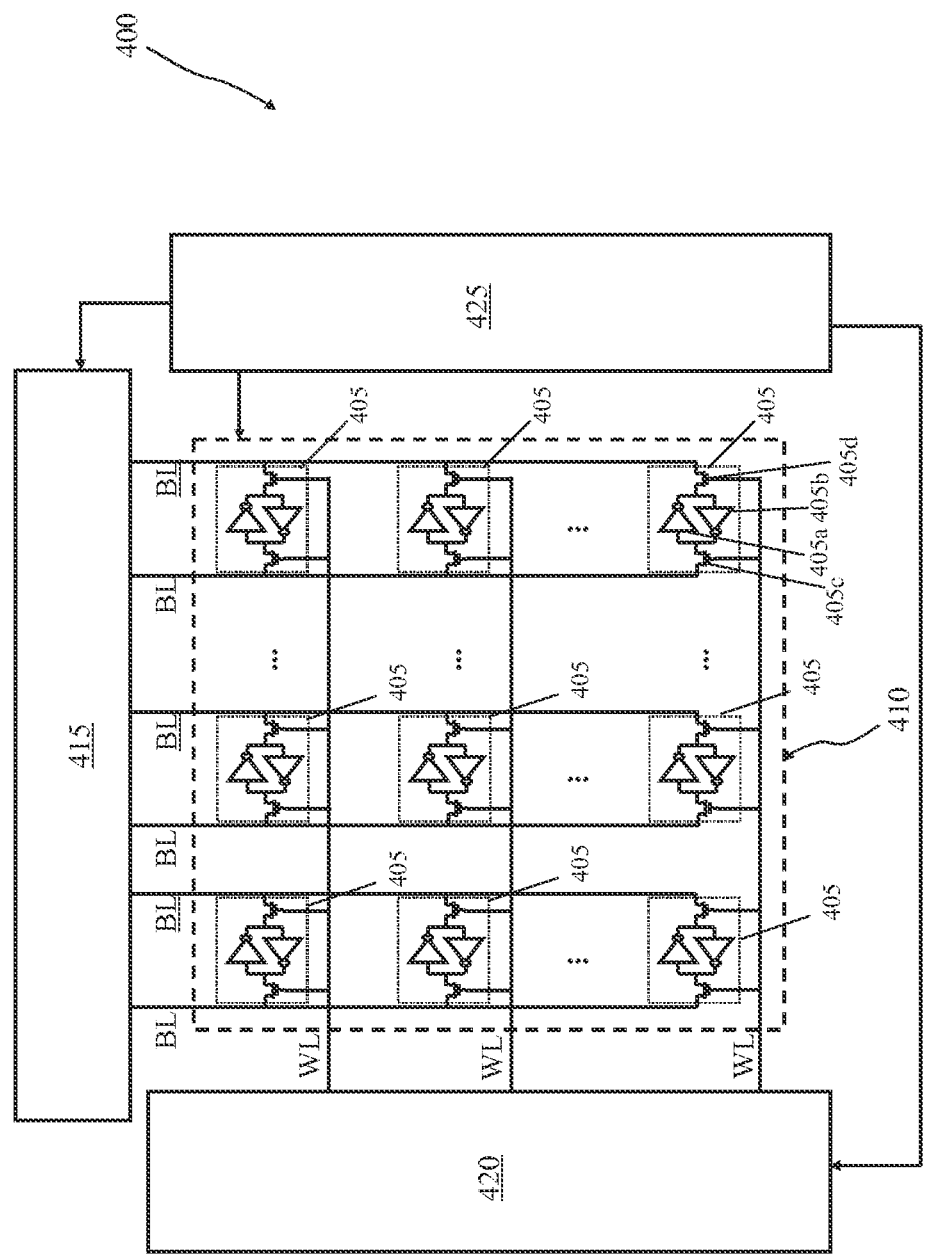
FIGS. 4A-4B are schematic views of a Non-Volatile memory element comprising an embedded radioisotope power source according to an embodiment
Figure 4B:
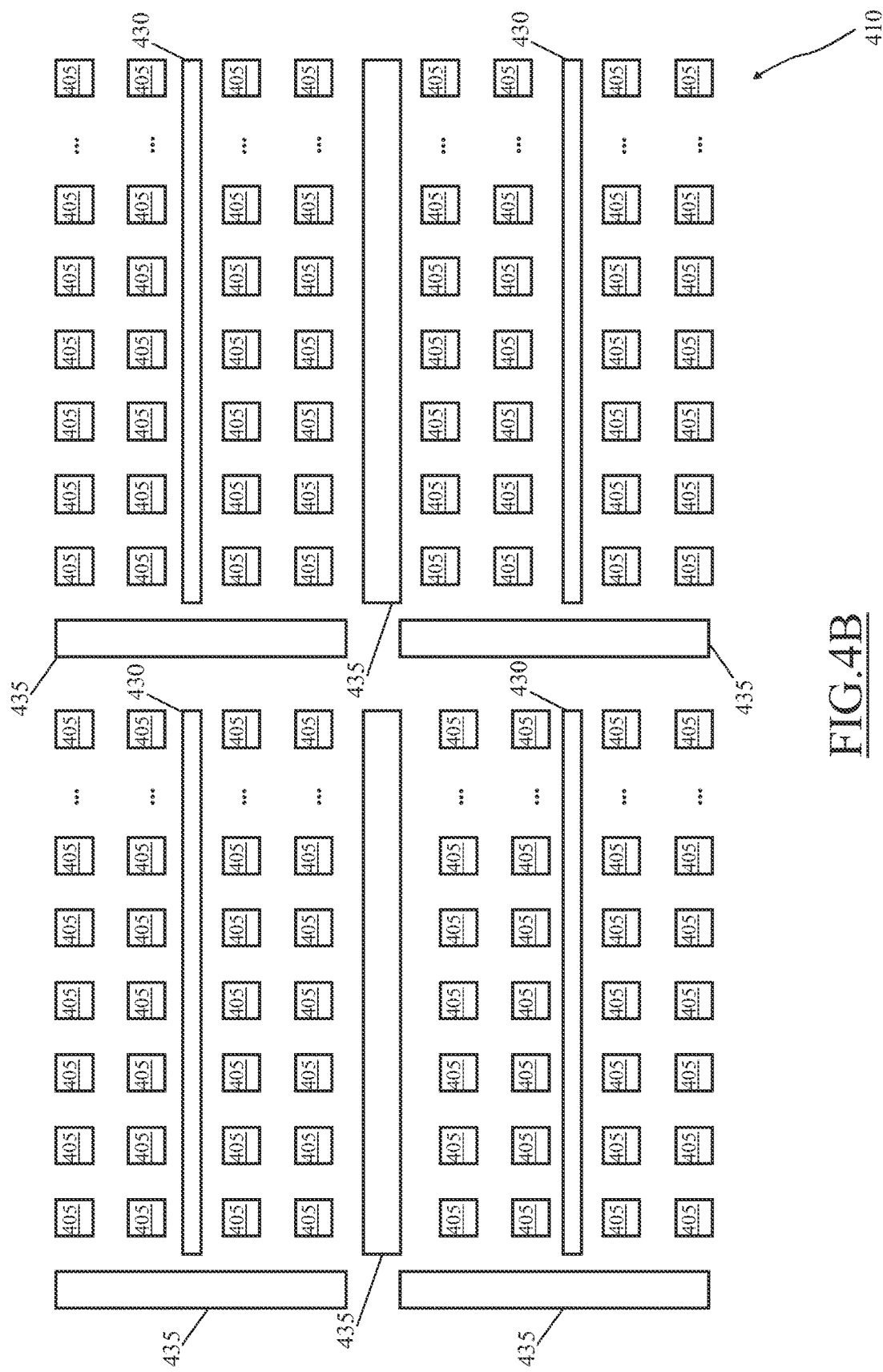

With reference to FIGS. 4A-4B, which are schematic views of a memory element 400 comprising an embedded radioisotope power source unit according to an embodiment, an example of electronic device comprising the embedded radioisotope power source unit according to an embodiment is described.

In the memory element 400, e.g., a Non-Volatile Static Random Access Memory or NV SRAM, the radioisotope power source is not used as a main power supply of memory element 400. Conversely, the radioisotope power supply is designed to compensate a leakage current affecting memory cells of the memory element 400, particularly, when a main power supply of the latter is disabled (i.e., when the main power supply of the memory element 400 is turned off), thus ensuring a retention of data stored in the memory element 400 even when the main supply is disabled (i.e., thus ensuring the non-volatility feature of the data stored in the SRAM).

Low operating voltages, i.e. close to a threshold voltage of CMOS transistors of memory cells of the memory element 400, and low operating currents (in the order of the nA) of CMOS transistors of memory cells of the memory element 400 allow embedding a plurality of low power (e.g., of the order of single nW) radioisotope power supply elements, e.g., containing small amounts of radioactive material such as Tritium, thus with a negligible detrimental effects of possibly stray (β) particles on the memory element 400.

In an embodiment, the radioisotope power source is distributed over the memory matrix 410 of the memory element 400, with one or more radioisotope power source units 135 that are embedded in the chip of the memory element among the memory cells 405 of the memory matrix 410 and electrically connected to one or more memory cells 405 of the memory element 400 to provide electric power thereto, rather than being provided concentrated in a predetermined region of a semiconductor chip on which the memory element 400 is formed (as in the case of the main power supply of the memory element 400).

For example, the memory element 400 of FIGS. 4A and 4B, is a NV SRAM comprising a plurality of 6 T memory cells 405.

As widely known, each 6 T memory cells 405 comprises six transistors, four of which that form a couple of inverters 405*a* and 405*b* coupled one with the other in a bistable arrangement that maintains a bit datum, and the remaining two transistors, or passgate transistors 405*c* and 405*d*, that are used to selectively connect the memory cell 405 with the remaining circuitry of the memory element 400 for reading/programming the bit datum in the memory cell 405.

Preferably, the memory cells 405 of the memory element 400 are arranged in rows and columns in order to form a memory matrix 410, usually subdivided in smaller blocks, or pages 410*p*.

All the memory cells 405 aligned on a same column are coupled to a reading/programming circuitry 415 by means of a couple of (complementary) bit lines BL and BL coupled with a respective access terminal of the passgate transistors 405c and 405d of the memory cells 405. Similarly, all the memory cells 405 aligned on a same row are coupled to a selection circuitry 420 by means of a word line RL coupled with a control terminal of the passgate transistors 405c and 405d of the memory cells 405.

Preferably, the matrix 410 is surrounded by a reading/programming circuitry 415 for accessing and read and/or write in the memory cells 405 of the matrix 410, a selection circuitry 420 for selecting one or more memory cells 405 of the matrix 410 to be read and/or written, and eventually other operating circuitries (such as timing circuitry, not shown) for ancillary operations, all of this circuitries may be commonly denoted to as 'peripheral circuitry'.

Usually, a main power supply circuitry 425 provides different power supply for the peripheral circuitry and for the memory matrix 410 in order to ensure noise robustness to provide an optimal power distribution and ground connection in the whole memory matrix 410.

Preferably, every n rows and m columns (e.g., between each couple of pages 410p) of the matrix 410 ground strip lines 430 (visible in the schematic view of FIG. 4B) are provided. Each ground strip line 430 is connected to a number of memory cells 405 of n rows and m columns of the matrix 410 adjacent to the ground strip line 430. Ground strip lines 430 are provided in order to guarantee the reduction of parasitic resistive paths along word lines WL, bit lines BL and BL, and lines for distributing electric power (not shown).

The NVM element 400 according to an embodiment, further comprises and an additional power supply (not detailed in the FIGS. 4A and 4B) comprising a radioisotope power source according to an embodiment.

Preferably, the additional power supply is provided directly within the memory matrix 410. Even more preferably, the additional power supply is distributed among the memory cells 405 of the memory matrix 410.

The additional power supply is designed to ensure the integrity of the bits stored in the memory cells 405 of the memory matrix 410 when the main supply circuitry is disabled (e.g., during a stand-by or during a power-off condition of the NV memory element 400).

Preferably, the additional power supply provides to the memory cells 405 of the memory matrix 410 a retention voltage Vr lower than an operating supply voltage Vdd and higher than a threshold voltage Vth of the transistors of the memory cells 405 (i.e., Vth<Vr<Vdd).

For example, the additional power supply may ensure data retention, by supplying to each memory cell 405 a retention voltage of about 1.4 V when an operating supply voltage Vdd of about 3.3 V is required for reading/programming operations and with a threshold voltage Vth of about 0.7 V.

In an embodiment, the additional power supply comprises a plurality of Radioisotope Strip Lines 435, or Beta Emitting Strip Lines (BESLs) in case the radioactive material 175 emits β particles.

Each Radioisotope Strip Line 435 comprises one or more radioisotope power source units, as the radioisotope power source unit 105 described above.

Preferably, the Radioisotope Strip Lines 435 are provided both along a bit line direction (i.e., parallel to the bit lines) and along a word line direction (i.e., parallel to the word line) every s rows and t columns (in the non limitative example of FIG. 4B s≠n and t≠m) in order to ensure a more even power distribution in the memory matrix 410.

The Radioisotope Strip Lines 435 are coupled with the memory cells 405 of each sub-portion of the memory matrix 410 so defined by the Radioisotope Strip Lines 435 in order to ensure a compensation of the leakage currents thereof.

Thus the additional power supply comprises Radioisotope Strip Lines 435 fully embedded in a memory matrix 410 of the memory element 400 that ensure improved data retention capabilities even in case the main power supply circuitry 425 energizing the memory element 400 is disabled (or undergoes a failure), with a very limited consumption of area and overall space required with respect to prior art solutions.

Moreover, the additional power supply featuring the Radioisotope Strip Lines 435 is able to operate for substantially the whole working life of the memory element 400 without requiring maintenances or without replacing any of its components.

What is claimed is:

1. An electronic device comprising:
    at least one electronic component formed in a chip of semiconductor material;
    at least one radioisotope power source unit comprising a radioactive material;
    wherein the at least one radioisotope power source unit is embedded in the chip of semiconductor material together with the at least one electronic component;
    wherein the at least one radioisotope power source unit comprises a conversion arrangement absorbing particles emitted by said radioactive material comprised in the least one radioisotope power source unit and converting the energy associated with said particles into electric power; and
    wherein the conversion arrangement provides said electric power to said at least one electronic component, the at least one electronic component exploiting said electric power;
    wherein the at least one radioisotope power source unit comprises a radioisotope cavity arranged for containing said radioactive material;
    wherein the conversion arrangement comprises a plurality of semiconductor diodes having a lateral structure and being electrically connected in series; and
    wherein between consecutive semiconductor diodes of said plurality of semiconductor diodes a respective intervening intrinsic semiconductor portion is provided, each of said intervening intrinsic semiconductor portions serving as a platform for respective electrically conductive structures which electrically couple together said consecutive semiconductor diodes.

2. An electronic device comprising:
    at least one electronic component formed in a chip of semiconductor material;
    at least one radioisotope power source unit comprising a radioactive material;
    wherein the at least one radioisotope power source unit is embedded in the chip of semiconductor material together with the at least one electronic component;
    wherein the at least one radioisotope power source unit is arranged for providing electric power to said at least one electronic component by absorbing particles emitted by said radioactive material comprised in the least one radioisotope power source unit;
    wherein the at least one radioisotope power source unit comprises a radioisotope cavity arranged for containing said radioactive material and a conversion arrangement arranged for absorbing particles emitted by said radioactive material and converting the energy associated with said particles in electric power;

wherein the conversion arrangement comprises a plurality of PIN diodes, having a lateral structure and being electrically connected in series; and wherein between consecutive PIN diodes of said plurality of PIN diodes a respective intervening semiconductor portion is provided, each of said intervening semiconductor portions serving as a platform for respective electrically conductive structures which electrically couple together said consecutive PIN diodes.

3. An electronic device comprising:

at least one electronic component formed in a chip of semiconductor material;

at least one radioisotope power source unit comprising a radioactive material;

wherein the at least one radioisotope power source unit is embedded in the chip of semiconductor material together with the at least one electronic component;

wherein the at least one radioisotope power source unit is arranged for providing electric power to said at least one electronic component by absorbing particles emitted by said radioactive material comprised in the least one radioisotope power source unit;

wherein the at least one radioisotope power source unit comprises a radioisotope cavity arranged for containing said radioactive material and a conversion arrangement arranged for absorbing particles emitted by said radioactive material and converting the energy associated with said particles in electric power;

wherein the conversion arrangement comprises a plurality of PIN diodes, having a lateral structure and being electrically connected in series; and wherein a resulting surface of the conversion arrangement has a continuous, planar structure formed by the flushing surfaces of the PIN diodes and the intervening portions.

4. An electronic device comprising:

at least one electronic component formed in a chip of semiconductor material;

at least one radioisotope power source unit comprising a radioactive material;

wherein the at least one radioisotope power source unit is embedded in the chip of semiconductor material together with the at least one electronic component;

wherein the at least one radioisotope power source unit is arranged for providing electric power to said at least one electronic component by absorbing particles emitted by said radioactive material comprised in the least one radioisotope power source unit;

wherein the at least one radioisotope power source unit comprises a radioisotope cavity arranged for containing said radioactive material and a conversion arrangement arranged for absorbing particles emitted by said radioactive material and converting the energy associated with said particles in electric power; and wherein the radioisotope cavity comprises an opening reaching a surface of the conversion arrangement, the radioactive material contained in the radioisotope cavity being at least partly in contact with said surface of the conversion arrangement.

5. An electronic device comprising:

at least one electronic component formed in a chip of semiconductor material;

at least one radioisotope power source unit comprising a radioactive material;

wherein the at least one radioisotope power source unit is embedded in the chip of semiconductor material together with the at least one electronic component;

wherein the at least one radioisotope power source unit is arranged for providing electric power to said at least one electronic component by absorbing particles emitted by said radioactive material comprised in the least one radioisotope power source unit;

wherein the at least one radioisotope power source unit is embedded in the semiconductor chip at a distance from the at least one electronic component, in the order of an absorption length associated with the particles emitted by the radioactive material; and wherein the at least one radioisotope power source unit is embedded in the semiconductor chip at a distance from the at least one electronic component equal to, or greater than, the 70% of an absorption length associated with the particles emitted by the radioactive material.

6. An electronic device comprising:

at least one electronic component formed in a chip of semiconductor material;

at least one radioisotope power source unit comprising a radioactive material;

wherein the at least one radioisotope power source unit is embedded in the chip of semiconductor material together with the at least one electronic component;

wherein the at least one radioisotope power source unit is arranged for providing electric power to said at least one electronic component by absorbing particles emitted by said radioactive material comprised in the least one radioisotope power source unit;

wherein said at least one electronic component comprises a memory element having a plurality of memory cells, and said at least one radioisotope power source unit is arranged for providing at least part of the electric power required by said memory element for storing data; and wherein the at least one radioisotope power source unit is arranged for compensating a leakage current affecting memory cells of the memory element, thus ensuring a retention of data stored in the plurality of memory cells of the memory element.

7. The electronic device according to claim 6, wherein:

each memory cell of the plurality of memory cells comprises at least one transistor; and the at least one radioisotope power source unit is arranged to supply a voltage lower than an operating supply voltage and higher than a threshold voltage of the at least one transistor of the memory cell.

8. An electronic device comprising:

at least one electronic component formed in a chip of semiconductor material;

at least one radioisotope power source unit comprising a radioactive material;

wherein the at least one radioisotope power source unit is embedded in the chip of semiconductor material together with the at least one electronic component;

wherein the at least one radioisotope power source unit is arranged for providing electric power to said at least one electronic component by absorbing particles emitted by said radioactive material comprised in the least one radioisotope power source unit;

wherein said at least one electronic component comprises a memory element having a plurality of memory cells, and said at least one radioisotope power source unit is arranged for providing at least part of the electric power required by said memory element for storing data;
wherein the at least one radioisotope power source unit comprises a plurality of radioisotope power source units;
wherein each one of the radioisotope power source units are embedded in the chip among the memory cells of the memory element and electrically connected to at least one of said memory cells of the memory element for providing electric power thereto;
wherein the memory cells of the memory elements are arranged in rows and columns forming a memory matrix; and
wherein the plurality of radioisotope power source units is arranged in a plurality of strip lines, each of said strip lines being provided between a predetermined number of rows of the memory cells and/or a predetermined number of columns of the memory cells, said strip lines being electrically coupled with the memory cells delimited by said strip lines.

9. An electronic device comprising:
at least one electronic component formed in a chip of semiconductor material;
at least one radioisotope power source unit comprising a radioactive material;
wherein the at least one radioisotope power source unit is embedded in the chip of semiconductor material together with the at least one electronic component;
wherein the at least one radioisotope power source unit comprises a conversion arrangement absorbing particles emitted by said radioactive material comprised in the least one radioisotope power source unit and converting the energy associated with said particles into electric power;
wherein the conversion arrangement provides said electric power to said at least one electronic component, the at least one electronic component exploiting said electric power,
wherein the at least one radioisotope power source unit comprises a radioisotope cavity arranged for containing said radioactive material;
wherein the conversion arrangement comprises a plurality of semiconductor diodes having a lateral structure and being electrically connected in series, and
wherein a resulting surface of the conversion arrangement has a continuous, planar structure formed by the flushing surfaces of the semiconductor diodes and the intervening intrinsic portions.

10. An electronic device comprising:
at least one electronic component formed in a chip of semiconductor material;
at least one radioisotope power source unit comprising a radioactive material;
wherein the at least one radioisotope power source unit is embedded in the chip of semiconductor material together with the at least one electronic component;
wherein the at least one radioisotope power source unit comprises a conversion arrangement absorbing particles emitted by said radioactive material comprised in the least one radioisotope power source unit and converting the energy associated with said particles into electric power;
wherein the conversion arrangement provides said electric power to said at least one electronic component, the at least one electronic component exploiting said electric power,
wherein the at least one radioisotope power source unit comprises a radioisotope cavity arranged for containing said radioactive material; and
wherein the radioisotope cavity comprises an opening reaching a surface of the conversion arrangement, the radioactive material contained in the radioisotope cavity being at least partly in contact with said surface of the conversion arrangement.

11. An electronic device comprising:
at least one electronic component formed in a chip of semiconductor material;
at least one radioisotope power source unit comprising a radioactive material;
wherein the at least one radioisotope power source unit is embedded in the chip of semiconductor material together with the at least one electronic component;
wherein the at least one radioisotope power source unit comprises a conversion arrangement absorbing particles emitted by said radioactive material comprised in the least one radioisotope power source unit and converting the energy associated with said particles into electric power;
wherein the conversion arrangement provides said electric power to said at least one electronic component, the at least one electronic component exploiting said electric power,
wherein the at least one radioisotope power source unit comprises a radioisotope cavity arranged for containing said radioactive material; and
wherein the radioactive material is a material that emits particles due to radioactive decay process, and wherein the radiation cavity comprises a cavity having a bottom provided at a distance from a surface of the conversion arrangement lower than an absorption length associated with the particles emitted by the radioactive material.

12. The electronic device according to claim 11, wherein the electronic component comprises a Micro-Electro-Mechanic System (MEMS) component.

13. An electronic device comprising:
at least one electronic component formed in a chip of semiconductor material;
at least one radioisotope power source unit comprising a radioactive material;
wherein the at least one radioisotope power source unit is embedded in the chip of semiconductor material together with the at least one electronic component;
wherein the at least one radioisotope power source unit comprises a conversion arrangement absorbing particles emitted by said radioactive material comprised in the least one radioisotope power source unit and converting the energy associated with said particles into electric power;
wherein the conversion arrangement provides said electric power to said at least one electronic component, the at least one electronic component exploiting said electric power; and
wherein said at least one electronic component comprises a memory element having a plurality of memory cells, and said at least one radioisotope power source unit is arranged for providing at least part of the electric power required by said memory element for storing data.

14. The electronic device according to claim 13, wherein the at least one radioisotope power source unit is embedded in the semiconductor chip at a distance from the at least one electronic component, in the order of an absorption length associated with the particles emitted by the radioactive material.

15. The electronic device according to claim 14, wherein the at least one radioisotope power source unit is embedded in the semiconductor chip at a distance from the at least one electronic component equal to, or greater than, the 70% of an absorption length associated with the particles emitted by the radioactive material.

16. The electronic device according to claim 13, wherein the radioactive material is a material that emits β particles.

17. The electronic device according to claim 16, wherein the radioactive material comprises Tritium.

18. The electronic device according to claim 16, wherein the radioactive material comprises Promethium.

19. The electronic device according to claim 13, wherein the at least one radioisotope power source unit is arranged for compensating a leakage current affecting memory cells of the memory element, thus ensuring a retention of data stored in the plurality of memory cells of the memory element.

20. The electronic device according to claim 19,
wherein each memory cell of the plurality of memory cells comprises at least one transistor, and
wherein the at least one radioisotope power source unit is arranged to supply a voltage lower than an operating supply voltage and higher than a threshold voltage of the at least one transistor of the memory cell.

21. The electronic device according to claim 13,
wherein the at least one radioisotope power source unit comprises a plurality of radioisotope power source units, and
wherein each one of the radioisotope power source units are embedded in the chip among the memory cells of the memory element and electrically connected to at least one of said memory cells of the memory element for providing electric power thereto.

22. The electronic device according to claim 21,
wherein the memory cells of the memory elements are arranged in rows and columns forming a memory matrix, and
wherein the plurality of radioisotope power source units is arranged in a plurality of strip lines, each of said strip lines being provided between a predetermined number of rows of the memory cells and/or a predetermined number of columns of the memory cells, said strip lines being electrically coupled with the memory cells delimited by said strip lines.

23. The electronic device according to claim 13, wherein the memory element is a Static Random Access Memory (SRAM).

24. The electronic device according to claim 13, where the electronic device is a Field Programmable Gate Array.

* * * * *